United States Patent
Grodzki

(10) Patent No.: US 9,678,188 B2
(45) Date of Patent: Jun. 13, 2017

(54) MAGNETIC RESONANCE SYSTEM AND METHOD TO ACQUIRE AT LEAST TWO MEASUREMENT DATA SETS FROM AN EXAMINATION SUBJECT

(71) Applicant: David Grodzki, Erlangen (DE)

(72) Inventor: David Grodzki, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 743 days.

(21) Appl. No.: 14/031,288

(22) Filed: Sep. 19, 2013

(65) Prior Publication Data

US 2014/0077810 A1 Mar. 20, 2014

(51) Int. Cl.
*G01V 3/00* (2006.01)
*G01R 33/56* (2006.01)
*G01R 33/561* (2006.01)

(52) U.S. Cl.
CPC ............ *G01R 33/56* (2013.01); *G01R 33/561* (2013.01)

(58) Field of Classification Search
CPC . G01R 33/482; G01R 33/483; G01R 33/4818; G01R 33/56; G01R 33/561
USPC .................................................. 324/307–309
See application file for complete search history.

(56) References Cited

U.S. PATENT DOCUMENTS

| | | | | |
|---|---|---|---|---|
| 7,511,489 B2* | 3/2009 | Fautz | ................. | G01R 33/5611 324/307 |
| 7,880,465 B2* | 2/2011 | Fung | ................. | G01R 33/4818 324/306 |
| 8,183,865 B2 | 5/2012 | Stemmer | | |
| 8,649,846 B2* | 2/2014 | Kassai | ................. | G01R 33/567 600/407 |
| 2008/0317315 A1* | 12/2008 | Stemmer | .......... | G01R 33/56509 382/131 |
| 2009/0039885 A1* | 2/2009 | Geppert | ............. | G01R 33/4818 324/309 |
| 2010/0244827 A1* | 9/2010 | Hennel | ............. | G01R 33/4616 324/309 |

(Continued)

FOREIGN PATENT DOCUMENTS

JP          11253423 A   *   9/1999

OTHER PUBLICATIONS

"Dual-Contrast Echo Planar Imaging with Keyhole: Application to Dynamic Contrast-Enhanced Perfusion Studies," Zaitsev et al., Physics in Medicine and Biology, vol. 50, pp. 4491-4505 (2005).

*Primary Examiner* — Susan Lee
(74) *Attorney, Agent, or Firm* — Schiff Hardin LLP

(57) ABSTRACT

In a magnetic resonance data acquisition of at least two measurement data sets of an examination subject, each of the at least two measurement data sets is acquired in at least three partial measurements. Each partial measurement covers a partial region of k-space corresponding to the examination subject to be examined, and the partial measurements are executed in series in an order such that two successive partial measurements are associated with different data sets of the at least two measurement data sets, and such that two successive partial measurements respectively do not measure the same partial region. A reduced movement sensitivity is achieved by the acquisition of the interleaved partial measurements associated with different measurement data sets. Unwanted refocusings (and therefore echo signals of residual magnetization) are also avoided by avoiding successive partial measurements that measure the same partial region.

9 Claims, 2 Drawing Sheets

(56) References Cited

U.S. PATENT DOCUMENTS

| | | | |
|---|---|---|---|
| 2011/0237931 A1* | 9/2011 | Kumai | G01R 33/5673 600/413 |
| 2011/0251477 A1* | 10/2011 | Schmitt | G01R 33/5635 600/410 |
| 2012/0148137 A1* | 6/2012 | Kimura | G01R 33/56509 382/131 |
| 2012/0177260 A1* | 7/2012 | Su | G06T 7/0012 382/128 |
| 2012/0229136 A1* | 9/2012 | Stemmer | G01R 33/5659 324/307 |
| 2012/0313641 A1 | 12/2012 | Labadie et al. | |

* cited by examiner

MAGNETIC RESONANCE SYSTEM AND METHOD TO ACQUIRE AT LEAST TWO MEASUREMENT DATA SETS FROM AN EXAMINATION SUBJECT

BACKGROUND OF THE INVENTION

Field of the Invention

The invention concerns a method to acquire at least two measurement data sets of an examination subject to be examined by means of a magnetic resonance system, as well as a magnetic resonance system; and an electronically readable data medium for implementing such a method.

Description of the Prior Art

Magnetic resonance (MR) is a known technique with which images of the inside of an examination subject can be generated. Expressed in a simplified form, the examination subject is positioned in a strong, static, homogeneous basic magnetic field (also called a $B_0$ field) with a field strength from 0.2 Tesla to 7 Tesla or more in a magnetic resonance apparatus, such that the nuclear spins of the examination subject orient along the basic magnetic field. To trigger nuclear magnetic resonance signals, radio-frequency excitation pulses (RF pulses) are radiated into the examination subject, and the triggered nuclear magnetic resonance signals are measured (ducted) as what are known as k-space data, on the basis of which MR images are reconstructed or spectroscopy data are determined. For spatial coding of the measurement data, rapidly switched magnetic gradient fields are superimposed on the basic magnetic field. The acquired measurement data are digitized and stored as complex numerical values in a k-space matrix. An associated MR image can be reconstructed from the k-space matrix populated with values, for example by means of a multidimensional Fourier transformation.

Magnetic resonance examinations are most often very loud. The main reason for this is the rapidly changing gradient fields, which lead to distortions and oscillation in the gradient coil, and this energy is transferred to the housing, and is perceived as banging by patients located in a magnetic resonance system. In addition to mechanical measures for noise reduction, it can also be sought to design the measurement sequences used for the examination to be as quiet as possible by keeping changes of the required gradient fields over time (dG/dt) as small as possible.

In general, most measurement sequences acquire measurement data by repeating a basic scheme (which includes at least one excitation pulse, gradients for spatial coding and a readout module) with differently switched gradients after a repetition time TR. An implementation of such a basic scheme thus corresponds to a partial measurement (also called a repetition).

MR measurement (data acquisition) sequences that are designated as "quiet" are known in which the gradients to be switched do not change, or change only insignificantly, during such a partial measurement and between successive repetitions. Examples of such measurement sequences are, for example, RASP ("Rapid Single Point"), SPRITE ("Single-Point Ramped Imaging with T1 Enhancement"), zTE ("Zero Echo Time"), SWIFT ("Sweep Imaging with Fourier Transformation") and PETRA ("Pointwise Encoding Time reduction with Radial Acquisition").

Furthermore, in MR examinations it is typical to implement a measurement multiple times and to average the different measurements in order to increase the signal-to-noise ratio (SNR) of the measurement. Two possibilities of data acquisition are known for MR measurements with at least one such averaging. A first possibility is to implement a measurement completely and, at the end thereof, the same measurement is started again in its entirety and repeated as often as desired (MDS1-MDS2-MDS3 . . . ). This procedure is also designated as an "outer averages" method. A second possibility is to repeat each partial measurement (repetition) as often as desired before the next partial measurement is started (again as often as desired) (MDS1_1-MDS2_1-MDS3_1-. . . -MDS1_2-MDS2_2-MDS3_2-. . . -MDS1_3-MDS2_3-MDS3_3-. . . ). This procedure is also designated as an "inner averages" method.

In the aforementioned quiet measurement sequences, however, the "inner averages" cannot be applied, because otherwise unwanted refocusings of residual magnetization between two identical partial measurements (MDSj_i-MDSj+1_i) lead to artifacts in an MR image reconstructed from the measurement data. However, the "outer averages" method has the disadvantage that it is very susceptible to patient movements, since partial measurements to be averaged with one another are acquired with a relatively large time interval.

SUMMARY OF THE INVENTION

An object of the invention is to provide a method, a magnetic resonance system, and an electronically readable data medium that allow an averaging of two measurements even given quiet measurement sequences, without the aforementioned disadvantages.

In a method according to the invention for the acquisition of at least two measurement data sets of an examination subject to be examined by means of a magnetic resonance system, each of the at least two measurement data sets is acquired in at least three partial measurements, with each partial measurement covering a partial region of k-space corresponding to the examination subject to be examined, and the partial measurements are executed in series in an order such that two successive partial measurements are associated with different data sets of the at least two measurement data sets, and such that two successive partial measurements respectively do not measure the same partial region.

Via the interleaved acquisition according to the invention of the partial measurements associated with different measurement data sets, a movement sensitivity that is reduced relative to an "outer averages" method is achieved. Unwanted refocusings, and therefore echo signals of residual magnetization, thus are also avoided by avoiding successive measurement, that measure the same partial region.

In an embodiment, two successive partial measurements respectively measure different partial regions of the measurement data sets associated with them, such that the jumps in the gradients to be switched for the successive partial measurements (which jumps are required for the measurements of the different partial regions) are small. This means that the jumps in the gradients that are to be switched for the successive partial measurements are selected such that the mechanical forces caused by the jumps at the gradient coils and the surrounding housing of the magnetic resonance system are kept in a small range, such that a noise development that possibly arises due to these mechanical forces can be tolerated well by a patient located in the magnetic resonance system. For example, the required jumps for gradients to be switched in successive partial measurements lie in particular in a range of below 50% of the largest gradient amplitude difference occurring in the preceding partial measurement, better even below 20% of the largest gradient amplitude difference occurring in the preceding partial measurement. The quiet character of the measurement sequences can thus be retained. For particularly quiet measurements, at least three quarters of the jumps in the gradients to be switched in successive partial measurements lie in a range of less than 5% of the largest gradient amplitude difference occurring in the preceding partial measurement.

A magnetic resonance system according to the invention for the acquisition of measurement data in an imaging area within an examination subject and creation of a series of image data sets has a basic field magnet, a gradient field system, at least one RF antenna; and a control device to control the gradient field system and the at least one RF antenna, to receive the measurement data acquired by the at least one RF antenna and to evaluate the measurement data and create image data sets. The control unit is designed to operate the magnetic resonance system to successively implement partial measurements in an order by means of the control device such that two complete measurement data sets of an examination subject to be examined are acquired, with each of the at least two measurement data sets being acquired in at least three partial measurements, and each partial measurement covering a partial region of k-space corresponding to the examination subject to be examined. The partial measurements are executed successively in an order such that two successive partial measurements are associated with different data sets of the at least two measurement data sets, and such that two successive partial measurements respectively do not cover the same partial region. The magnetic resonance system thus is designed to implement a method according to the invention as described herein.

The invention also encompasses a non-transitory, computer-readable data storage medium encoded with programming instructions that, when the storage medium is loaded into a computerized control and evaluation system of a magnetic resonance apparatus, cause the computerized control and evaluation system to operate the magnetic resonance apparatus according to the method described above.

The advantages and embodiments indicated with regard to the method analogously apply to the magnetic resonance system and the electronically readable data medium.

DESCRIPTION OF THE PREFERRED EMBODIMENTS

Figure 1:
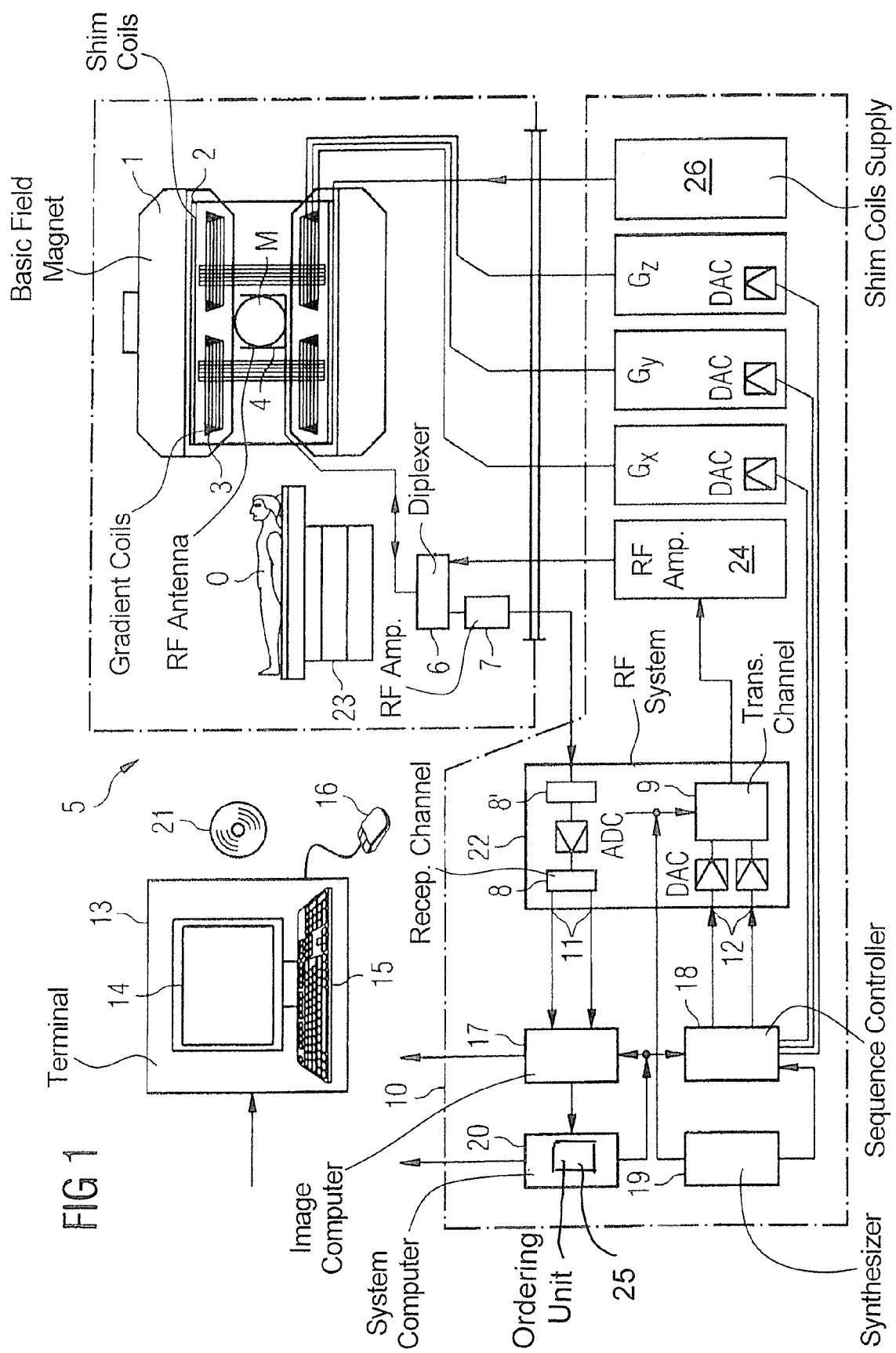
FIG. 1 schematically illustrates a magnetic resonance system according to the invention.

FIG. 1 is a schematic representation of a magnetic resonance system 5 (a magnetic resonance imaging or magnetic resonance tomography apparatus). A basic field magnet 1 generates a temporally constant, strong magnetic field for polarization or alignment of nuclear spins in an examination subject U (for example a part of a human body that is to be examined) which is examined while lying on a table 23 in the magnetic resonance system 5. The high homogeneity of the basic magnetic field that is required for the magnetic resonance measurement is defined in a typically (but not necessarily) spherical measurement volume M in which are arranged the parts of the human body that are to be examined. To support the homogeneity requirements, and in particular to eliminate temporally invariable influences, shim plates made of ferromagnetic material are mounted at a suitable location. Temporally variable influences are eliminated by shim coils 2 fed by a shim coils supply 26.

In the basic field magnet 1, a cylindrical gradient coil system 3 is used that includes three sub-windings. Each sub-winding is supplied by an amplifier with current to generate a gradient field—for example a linear (also temporally variable) gradient field—in the respective direction of the Cartesian coordinate system. The first sub-winding of the gradient field system 3 generates a gradient $G_x$ in the x-direction; the second sub-winding generates a gradient $G_y$ in the y-direction; and the third sub-winding generates a gradient $G_z$ in the z-direction. Each amplifier includes a digital/analog converter that is controlled by a sequence controller 18 for accurately-timed generation of gradient pulses.

Located within the gradient field system 3 are one or more radio-frequency antennas 4, such as at least one multichannel RF transmission coil and at least one RF reception coil, which convert the radio-frequency pulses emitted by a radio-frequency power amplifier 24 into an alternating magnetic field for excitation of the nuclei and deflection of the nuclear spins of the examination subject U out of the aforementioned alignment. Each radio-frequency antenna 4 has one or more RF transmission coils and one or more RF reception coils in the form of an annular (advantageously linear or matrix-like) arrangement of component coils. The alternating field emanating from the processing nuclear spins (normally the spin echo signals caused by a pulse sequence composed of one or more radio-frequency pulses and one or more gradient pulses) is also converted by the RF reception coils of the respective radio-frequency antenna 4 into a voltage (measurement signal), which is supplied via an amplifier 7 to a radio-frequency reception channel 8 of a radio-frequency system 22. The radio-frequency system 22 furthermore has a transmission channel 9 in which the radio-frequency pulses are generated for the excitation of the nuclear magnetic resonance. The respective radio-frequency pulses are digitally represented in the sequence controller 18 as a series of complex numbers based on a pulse sequence predetermined by the system computer 20. This number sequence is supplied as a real part and imaginary part to a digital/analog converter in the radio-frequency system 22 via respective inputs 12, and from the digital/analog converter to the transmission channel 9. In the transmission channel 9, the pulse sequences are modulated on a radio-frequency carrier signal whose base frequency corresponds to the center frequency.

Switching from transmission operation to reception operation takes place via a transmission/reception diplexer 6. The RF transmission coils of the radio-frequency antenna(s) 4 radiate(s) the radio-frequency pulses for excitation of the nuclear spins into the measurement volume M, and resulting echo signals are scanned via the RF reception coil(s). The correspondingly acquired nuclear magnetic resonance signals are phase-sensitively demodulated to an intermediate frequency in a reception channel 8' (first demodulator) of the radio-frequency system 22 and digitized in an analog/digital converter (ADC). This signal is further demodulated to a frequency of 0. The demodulation to a frequency of 0 and the separation into real part and imaginary part occur in a second demodulator 8 after the digitization in the digital domain. An MR image or three-dimensional image data set can be reconstructed by an image computer 17 from the measurement data acquired in such a manner. The administration of the measurement data, the image data and the control programs takes place via the system computer 20. Based on a specification with control programs, the sequence controller 18 monitors the generation of the respective desired pulse sequences and the corresponding scanning of k-space. In particular, the sequence controller 18 controls the accurately-timed switching of the gradients, the emission of the radio-frequency pulses with defined phase amplitude and the reception of the nuclear magnetic resonance signals.

The time base for the radio-frequency system 22 and the sequence controller 18 is provided by a synthesizer 19. The selection of corresponding control programs to generate an acquisition of measurement data (which control programs are stored on a DVD 21, for example); the selection of a measurement volume corresponding to the examination subject to be examined, which measurement volume should be excited and from which measurement data should be received; the number of desired measurement data sets of the examination subject U to be examined; and possibly a selection of the number of desired partial measurements per measurement data set; and possibly the selection of the measurement sequence type to be used; and the presentation of a generated MR image take place via, for example, a terminal 13, which has a keyboard 15, a mouse 16 and a monitor 14.

The system computer 20 furthermore has an ordering unit 25 that sets the order of the partial measurements to respectively acquire a number of measurement data sets.

Figure 2:
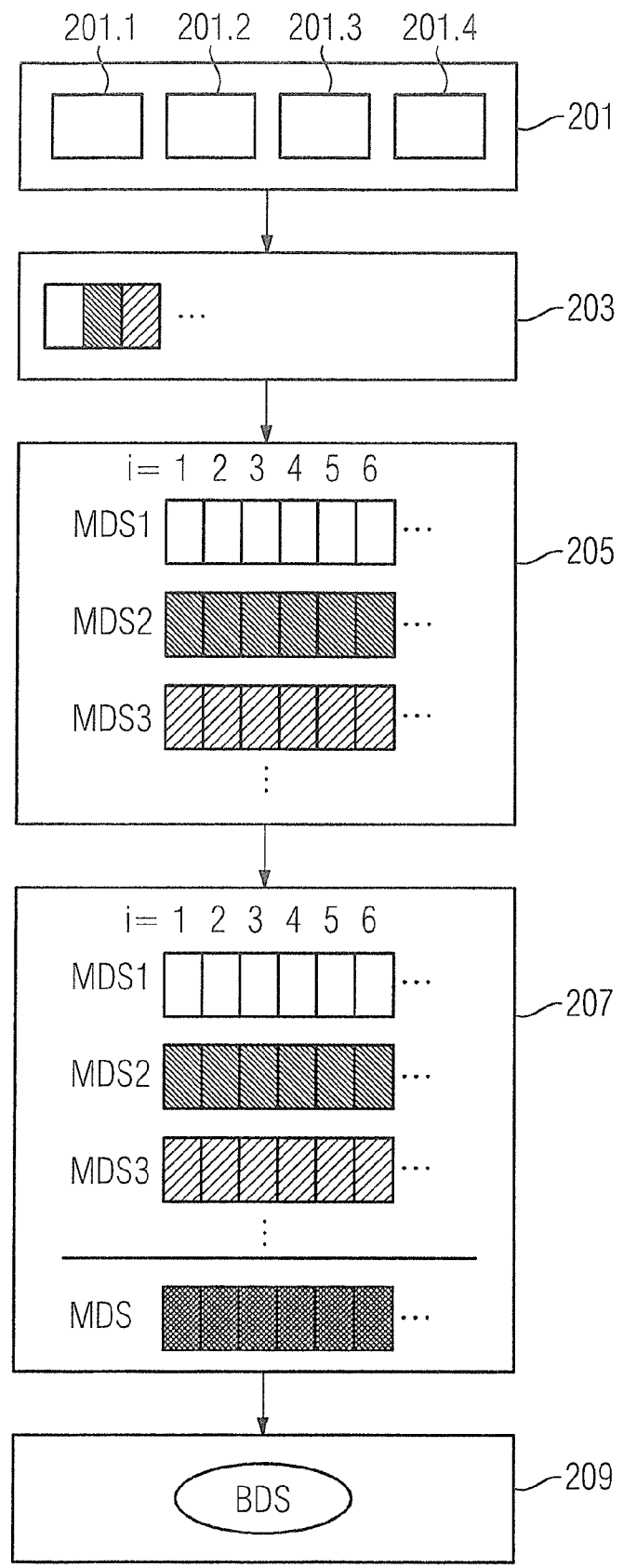
FIG. 2 is a flowchart an embodiment of a method according to the invention.

FIG. 2 is a flowchart of an embodiment of a method according to the invention. To prepare the measurement (Block 201), for example, a desired measurement volume in which the examination subject to be examined is located is predetermined (in a typical manner, for example) via a terminal of a magnetic resonance system (Block 201.1); a number of measurement data sets to be acquired (at least two) are selected (Block 201.2); a desired measurement sequence type to be used is possibly selected (Block 201.3); and a number of partial measurements (what are known as repetitions) per measurement data set are possibly selected (Block 201.4).

For example, an order of the partial measurements to be implemented is determined (Block 203) by means of an ordering unit of the magnetic resonance system, in particular from the number of desired measurement data sets and from the desired number of partial measurements per measurement data set (in the event that this has not already been provided, for example by the measurement sequence type).

The partial measurements are executed in series in an order such that two successive partial measurements are associated with different data sets of the at least two measurement data sets, and such that two successive partial measurements respectively do not measure the same partial region of k-space corresponding to the examination subject to be examined.

For example, the order of the partial measurements is established such that respective partial measurements of the different desired measurement data sets are successively executed, meaning that a partial measurement which is associated with a second measurement data set follows a partial measurement, which is associated with a first measurement data set, and is possibly followed by a partial measurement which is associated with a third measurement data set, etc.

In an embodiment, all partial measurements of the desired measurement data sets are implemented by means of the same measurement sequence type. In particular, the partial measurements for the desired at least two measurement data sets are implemented corresponding to partial measurements of a RASP sequence, or a SPRITE sequence, or a zTE sequence, or a SWIFT sequence, or a PETRA sequence.

In one exemplary embodiment in which precisely two measurement data sets are acquired, the partial measurements of the second measurement data set can be shifted (for example by two partial measurements) relative to the first measurement data set:

. . . -MDS1_i-MDS2_i-2-MDS1_i+1-MDS2_i-1-MDS1_i+2-MDS2_i-MDS1_i+3-MDS2_i+1-MDS1_i+4- . . . , wherein MDS1 stands for the first measurement data set and MDS2 stands for the second metadata set, and the index separated with underscore indicates the respective partial measurement.

Two successive partial measurements therefore measure partial regions between which are situated a maximum of two additional partial regions that are not measured by the successive partial measurements (for example, in the order indicated above two additional partial regions that are not measured by the successive partial measurements are situated between the partial measurements MDS2_i-2-MDS1_i+1. In contrast to this, only one additional partial region that is not measured by the successive partial measurements is situated between the partial measurements MDS1_i-MDS2_i-2). In such an exemplary embodiment, jumps in the gradients to be switched remain very small between two partial measurements. The measurement therefore is executed quietly.

Via the measurement of all partial measurements (Block 205), a desired number of measurement data sets MDS1, MDS2, MDS3, . . . , (respectively comprising the same number of partial measurements 1) is thus obtained. In FIG. 2, this is schematically represented by the measurement data sets MDS1, MDS2, MDS3, which are measured in i partial measurements which are represented as blocks (shaded differently per measurement data set) of the respective measurement data sets up to i=6. i>6 will be typical. In Block 203 of FIG. 2, partial measurements that are shaded corresponding to their associated measurement data set are shown to illustrate the order.

In an exemplary embodiment, at least two of the measurement data sets MDS1, MDS2, MDS3, . . . can be processed into one measurement data set MDS, wherein the processing of the at least two of the measured measurement data sets MDS1, MDS2, MDS3, . . . into one measurement data set includes an averaging method in which all identical partial measurements (i.e. partial measurements which scan the same partial region of k-space corresponding to the examination subject to be examined) are offset with one another (for example via average calculation or calculating a median or the like) in order to obtain the one measurement data set MDS.

Furthermore, an image data set BDS can in particular be reconstructed from the measurement data set MDS created in this way, and therefore from the at least two measurement data sets. For this, this image data set BDS as well as all measurement data sets MDS1, MDS2, MDS3, . . . and MDS and all partial measurements are stored in a control device of the magnetic resonance system, for example, and can be displayed at a screen of the magnetic resonance system, for example.

In the method according to the invention a complete measurement is thus not implemented (similar to as in the "inner averages" method) and then repeated; rather, individual partial measurements are repeated. However, what is different than in an "inner averages" method is that the same partial measurements which cover the same partial region of k-space corresponding to the examination subject to be examined do not follow one another directly, but rather are interleaved with one another. The gradients to be switched thereby always change between the individual measured partial measurements. An unwanted refocusing of the residual magnetization of the preceding partial measurements can thus be prevented. Furthermore, because gradient jumps between individual partial measurements are not too large, the measurement as a whole can proceed quietly.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method to acquire at least two magnetic resonance measurement data sets from an examination subject, comprising:
   operating a magnetic resonance data acquisition unit, in which an examination subject is located, to acquire at least two magnetic resonance measurement data sets in at least three partial data acquisition measurements, each partial magnetic resonance measurement covering a partial region of k-space corresponding to the examination subject; and
   operating said magnetic resonance data acquisition unit to execute said partial magnetic resonance measurements in a series in an order that causes two successive partial magnetic resonance measurements to be associated with different data sets of the at least two magnetic resonance measurement data sets, and that causes two successive partial magnetic resonance measurements to not acquire data from a same partial region of the examination subject.

2. A method as claimed in claim 1 comprising operating said data acquisition unit with two successive partial magnetic resonance measurements respectively acquiring data from different partial regions of the magnetic resonance measurement data sets associated therewith, while causing jumps in gradients that are activated for the successive partial magnetic resonance measurements, which are required for acquiring the different partial regions, to be noise-reducingly small.

3. A method as claimed in claim 1 comprising operating said data acquisition unit with the partial magnetic resonance measurements for the at least two magnetic resonance measurement data sets being implemented with a same magnetic resonance measurement sequence type.

4. A method as claimed in claim 1 wherein said partial magnetic resonance measurements for said at least two magnetic resonance measurement data sets are implemented according to a magnetic resonance measurement sequence type selected from the group consisting of a RASP sequence, a SPRITE sequence, a zTe sequence, a SWIFT sequence, and a PETRA sequence.

5. A method as claimed in claim 1 comprising, in a processor, processing said at least two magnetic resonance measurement data sets to form a single magnetic resonance measurement data set by averaging said at least two magnetic resonance measurement data sets.

6. A method as claimed in claim 5 comprising, in said processor, reconstructing an image data set from said single measurement data set.

7. A method as claimed in claim 1 comprising operating said magnetic resonance data acquisition unit to acquire two successive partial magnetic resonance measurements from respective partial regions of the examination subject between which, at most, two additional partial regions are situated from which magnetic resonance data are not acquired by the successive partial magnetic resonance measurements.

8. A magnetic resonance apparatus comprising:
   a magnetic resonance data acquisition unit;
   a control unit configured to operate the magnetic resonance data acquisition unit, in which an examination subject is located, to acquire at least two magnetic resonance measurement data sets in at least three partial data acquisition measurements, each partial magnetic resonance measurement covering a partial region of k-space corresponding to the examination subject; and
   said control unit being configured to operate said magnetic resonance data acquisition unit to execute said partial magnetic resonance measurements in a series in an order that causes two successive partial magnetic resonance measurements to be associated with different data sets of the at least two magnetic resonance measurement data sets, and that causes two successive partial magnetic resonance measurements to not acquire data from a same partial region of the examination subject.

9. A non-transitory, computer-readable data storage medium encoded with programming instructions, said storage medium being loaded into a computerized control and evaluation system of a magnetic resonance apparatus, that also comprises a magnetic resonance data acquisition unit, said programming instructions causing said computerized control and evaluation system to:
   operate a magnetic resonance data acquisition unit, in which an examination subject is located, to acquire at least two magnetic resonance measurement data sets in at least three partial data acquisition measurements, each partial magnetic resonance measurement covering a partial region of k-space corresponding to the examination subject; and
   operate said magnetic resonance data acquisition unit to execute said partial magnetic resonance measurements in a series in an order that causes two successive partial magnetic resonance measurements to be associated with different data sets of the at least two magnetic resonance measurement data sets, and that causes two successive partial magnetic resonance measurements to not acquire data from a same partial region of the examination subject.

* * * * *